(12) United States Patent
Yeon et al.

(10) Patent No.: US 11,233,103 B2
(45) Date of Patent: Jan. 25, 2022

(54) ORGANIC LIGHT-EMITTING DISPLAY APPARATUS

(71) Applicant: SAMSUNG DISPLAY CO., LTD., Yongin-si (KR)

(72) Inventors: Kiyoung Yeon, Yongin-si (KR); Haeyoung Yun, Yongin-si (KR); Junghyun Cho, Yongin-si (KR); Younggil Park, Yongin-si (KR); Dongyoun Yoo, Yongin-si (KR); Wooyoung Lee, Yongin-si (KR); Sooim Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/541,467

(22) Filed: Aug. 15, 2019

(65) Prior Publication Data

US 2020/0058719 A1 Feb. 20, 2020

(30) Foreign Application Priority Data

Aug. 16, 2018 (KR) .................. 10-2018-0095738

(51) Int. Cl.
*H01L 27/32* (2006.01)
*H01L 51/52* (2006.01)

(52) U.S. Cl.
CPC ...... *H01L 27/3248* (2013.01); *H01L 51/5253* (2013.01); *H01L 51/5206* (2013.01); *H01L 51/5221* (2013.01)

(58) Field of Classification Search
CPC ............. H01L 27/3248; H01L 51/5253; H01L 51/5206; H01L 51/5221
See application file for complete search history.

(56) References Cited

U.S. PATENT DOCUMENTS 9,818,985 B2 11/2017 Cho et al.
9,837,629 B2 12/2017 Yun et al.
9,859,347 B2 1/2018 Jin et al.
(Continued)

FOREIGN PATENT DOCUMENTS

JP 2008-235605 10/2008
KR 10-0615274 8/2006
(Continued)

*Primary Examiner* — Marc Anthony Armand
(74) *Attorney, Agent, or Firm* — F. Chau & Associates, LLC (57) ABSTRACT

An organic light-emitting display apparatus includes a substrate; thin film transistors; a protective layer that includes a plurality of concave-convex units disposed in a pixel area; an organic light-emitting device disposed on the protective layer; and an encapsulation unit that covers the organic light-emitting device. Each of the concave-convex units protrudes from a surface of the protective layer. The organic light-emitting device includes a pixel electrode, an emission layer, and an opposite layer sequentially stacked on the concave-convex unit, and a distance between the pixel electrode and the opposite electrode is determined by 5%≤ (a/b)≤18%, wherein 'a' is a vertical distance with respect to the surface of the protective layer between the pixel electrode and the opposite electrode and 'b' is a minimum distance between the pixel electrode and the opposite electrode.

20 Claims, 6 Drawing Sheets

(56) References Cited

U.S. PATENT DOCUMENTS

| | | | |
|---|---|---|---|
| 9,929,222 B2 | 3/2018 | Lim et al. | |
| 2009/0206733 A1 | 8/2009 | Hwang et al. | |
| 2015/0014636 A1* | 1/2015 | Kang | H01L 27/3258 257/40 |
| 2017/0005286 A1 | 1/2017 | Yun et al. | |
| 2018/0006273 A1* | 1/2018 | Kim | H01L 51/5268 |
| 2019/0006626 A1* | 1/2019 | Kim | H01L 51/5262 |
| 2019/0326553 A1* | 10/2019 | Abe | H01L 27/32 |

FOREIGN PATENT DOCUMENTS

| | | |
|---|---|---|
| KR | 10-2009-0089151 | 8/2009 |
| KR | 10-2014-0072711 | 6/2014 |
| KR | 10-2017-0005272 | 1/2017 |
| KR | 10-1730609 | 4/2017 |
| KR | 10-2017-0123569 | 11/2017 |

* cited by examiner

ORGANIC LIGHT-EMITTING DISPLAY APPARATUS

CROSS-REFERENCE TO RELATED APPLICATION

This application claims priority under 35 U.S.C. § 119 from, and the benefit of, Korean Patent Application No. 10-2018-0095738, filed on Aug. 16, 2018 in the Korean Intellectual Property Office, the contents of which are herein incorporated by reference in their entirety.

BACKGROUND

1. Technical Field

One or more embodiments relate to an organic light-emitting display apparatus.

2. Discussion of the Related Art

In general, display apparatuses can be used in mobile devices, such as smart phones, laptop computers, digital cameras, camcorders, personal digital assistants (PDAs), notebook computers, or tablet personal computers (PCs), or electronic devices, such as desktop computers, televisions, outdoor advertisement boards, sample display devices, in-car instrument panels, and head-up displays (HUDs).

Recently, thinner display apparatuses have been released on the market.

Flexible display apparatuses are easy to carry and can be incorporated into various types of devices. Among the various types of display apparatuses, flexible display apparatuses based on an organic light-emitting display technology are the most popular. A flexible display apparatus may be bent in one direction.

An organic light-emitting display apparatus includes a pixel electrode disposed above a substrate, an opposite electrode disposed above the pixel electrode, and an organic emission layer between the pixel electrode and the opposite electrode.

Colors displayed by an organic light-emitting display apparatus can vary according to viewing angles. In addition, when a gap between a pixel electrode and an opposite electrode is not uniform, a current unbalance phenomenon may occur in an area in which the gap between the pixel electrode and the opposite electrode is narrow. Accordingly, reliability of the organic light-emitting display apparatus is degraded.

SUMMARY

One or more embodiments provide an organic light-emitting display apparatus having higher reliability.

According to one or more embodiments, an organic light-emitting display apparatus includes: a substrate that includes a plurality of pixel areas; a plurality of thin film transistors disposed on the substrate; a protective layer that covers the thin film transistors and includes a plurality of concave-convex units disposed in the pixel areas; an organic light emitting device disposed on the protective layer and that includes a pixel electrode, an emission layer, and an opposite electrode; and an encapsulation unit disposed on the substrate and that covers the organic light emitting device. Each of the plurality of concave-convex units protrudes from a surface of the protective layer. The pixel electrode, the emission layer, and the opposite electrodes are sequentially stacked on the plurality of concave-convex units, and a distance between the pixel electrode and the opposite electrode is in the range of $5\% \leq (a/b) \leq 18\%$, wherein 'a' is a vertical distance with respect to the surface of the protective layer between the pixel electrode and the opposite electrode and 'b' is a minimum distance between the pixel electrode and the opposite electrode.

According to one or more embodiments, the pixel electrode may include a first surface that faces each of the plurality of concave-convex units and a second surface opposite to the first surface, the opposite electrode may include a first surface that faces the emission layer and a second surface opposite to the first surface, the vertical distance between the pixel electrode and the opposite electrode corresponds to a vertical distance from the second surface of the pixel electrode to the first surface of the opposite electrode, and the minimum distance between the pixel electrode and the opposite electrode may correspond to a minimum distance from the second surface of the pixel electrode to the first surface of the opposite electrode.

In an embodiment, the surface of the protective layer may be parallel to a horizontal surface of the substrate, each of the plurality of concave-convex units may have a forwardly-tapered shape, and an angle between a slope of each of the plurality of concave-convex units and the surface of the protective layer may be less than or equal to 35 degrees.

In an embodiment, an area in a plan view of each of the plurality of concave-convex units may be less than or equal to 20% of an area of the pixel area.

In an embodiment, a minimum distance between adjacent concave-convex units may be determined by $(d/e) \times 100 > 5$, wherein 'd' is a distance between centers of the adjacent concave-convex units and 'e' is a height of each of the plurality of concave-convex units.

In an embodiment, a cross-section of each of the plurality of concave-convex units has a semicircular shape.

In an embodiment, each of the plurality of concave-convex units is shaped in a plan view as one of a polygon, a circle, an oval, a wavy shape, a stripe, or a dot.

In an embodiment, a boundary of each of the plurality of concave-convex units may be rounded.

In an embodiment, the organic light-emitting display apparatus may further include a quantum dot layer disposed on the organic light emitting device.

In an embodiment, the encapsulation unit includes at least one inorganic layer and at least one organic layer that are sequentially stacked, and the quantum dot layer may be disposed on an upper surface of the encapsulation unit.

According to one or more embodiments, an organic light-emitting display apparatus includes: a substrate that includes a plurality of pixel areas; a plurality of thin film transistors disposed on the substrate; a protective layer that covers the thin film transistors and includes a plurality of concave-convex units disposed in the pixel areas; an organic light emitting device disposed on the protective layer and that includes a pixel electrode, an emission layer, and an opposite electrode; and an encapsulation unit disposed on the substrate and that covers the organic light emitting device. Each of the plurality of concave-convex units protrudes from a surface of the protective layer and has a slope, and a minimum distance between adjacent concave-convex units is determined by $((d/e) \times 100) \geq 5$, wherein 'd' is a distance between centers of the adjacent concave-convex units and 'e' is a height of each of the concave-convex units.

In an embodiment, a surface of the protective unit is parallel to a horizontal surface of the substrate, and an angle formed by the slope of each of the plurality of concave-convex units and the surface of the protective layer may be less than or equal to 35 degrees.

In an embodiment, the pixel electrode, the emission layer, and the opposite electrode are sequentially stacked on the plurality of concave-convex units, and a distance between the pixel electrode and the opposite electrode may be in the range of 5%≤(a/b)≤18%, wherein 'a' is a vertical distance with respect to the surface of the protective layer between the pixel electrode and the opposite electrode and 'b' is a minimum distance between the pixel electrode and the opposite electrode.

In an embodiment, the pixel electrode includes a first surface that faces each of the plurality of concave-convex units and a second surface opposite to the first surface, the opposite electrode includes a first surface that faces the emission layer and a second surface opposite to the first surface, wherein the vertical surface between the pixel electrode and the opposite electrode may correspond to a vertical distance from the second surface of the pixel electrode to the first surface of the opposite electrode, and the minimum distance between the pixel electrode and the opposite electrode may correspond to a minimum distance from the second surface of the pixel electrode to the first surface of the opposite electrode.

In an embodiment, an area in a plan view of each of the plurality of concave-convex units may be less than or equal to 20% of an area of the pixel area.

In an embodiment, a cross-section of each of the plurality of concave-convex units has a semicircular shape.

In an embodiment, each of the plurality of concave-convex units is shaped in a plan view as one of a polygon, a circle, an oval, a wavy shape, a stripe, or a dot.

In an embodiment, a boundary of each of the plurality of concave-convex units may be rounded.

In an embodiment, the organic light-emitting display apparatus may further include a quantum dot layer disposed on the organic light emitting device.

According to one or more embodiments, an organic light-emitting display apparatus includes: a substrate that includes a plurality of pixel areas; a plurality of thin film transistors disposed on the substrate; a protective layer that covers the plurality of thin film transistors and includes a plurality of concave-convex units disposed in the plurality of pixel areas; an organic light-emitting device disposed on the protective layer and that includes a pixel electrode, an emission layer, and an opposite electrode; and an encapsulation unit disposed on the substrate and that covers the organic light-emitting device. A surface of the protective layer is parallel to a horizontal surface of the substrate, each of the plurality of concave-convex units protrudes from the surface of the protective layer, an angle between a slope of each of the plurality of concave-convex units and the surface of the protective layer is less than or equal to 35 degrees, and an area in a plan view of each of the plurality of concave-convex units is less than or equal to 20% of an area of the pixel area.

DETAILED DESCRIPTION

Reference will now be made in detail to embodiments, examples of which are illustrated in the accompanying drawings. Features of embodiments of the present disclosure and methods of achieving the features will be described more fully with reference to the accompanying drawings, in which exemplary embodiments of the present disclosure are shown. However, embodiments of the present disclosure may take many different forms and are not limited to the embodiments set forth herein.

In the embodiments set forth herein, when a component such as a layer, a film, a region, or a plate, is referred to as being "on" another component, the component may be directly on the other component or intervening components may be present thereon. For convenience of explanation, sizes of the sizes of components may be exaggerated. I Hereinafter, embodiments of an organic light-emitting display apparatus will be described in detail with reference to attached drawings. In descriptions with reference to the attached drawings, same reference numerals may be given to same components, and overlapping descriptions thereof will be omitted.

Figure 1:
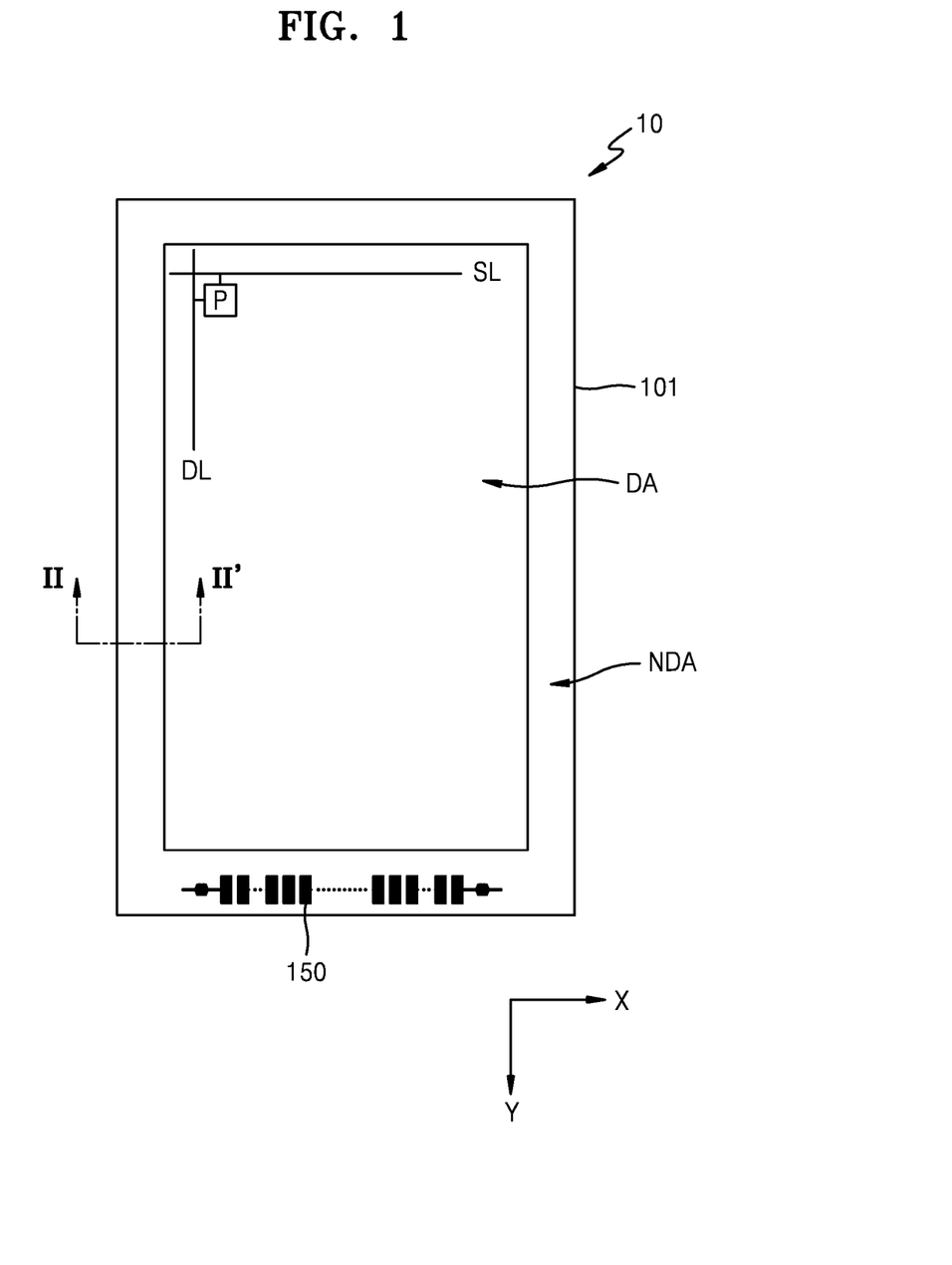
FIG. 1 is a top plan view of an organic light-emitting display apparatus according to an embodiment of the present disclosure.

FIG. 1 illustrates an organic light-emitting display apparatus 10 according to an embodiment of the present disclosure.

Referring to FIG. 1, the organic light-emitting display apparatus 10 includes a substrate 101. The substrate 101 may be a glass substrate, a polymer substrate, or a flexible film. The substrate 101 may be transparent, opaque, or semi-transparent. The substrate 101 may be flexible.

According to an embodiment, the substrate 101 includes a display area DA in which an image is displayed, and a non-display area NDA outside of the display area DA. Pixels P are arranged in the display area DA. Each of the pixels P is disposed in an area where a data line DL that extends in a Y-direction and a scan line SL that extends in an X-direction cross each other. A power line that supplies power to the pixels is disposed in the non-display area NDA. A pad unit 150 that transmits an electrical signal from a power supply device or a signal generator to the display area DA is disposed in the non-display area NDA.

Figure 2:
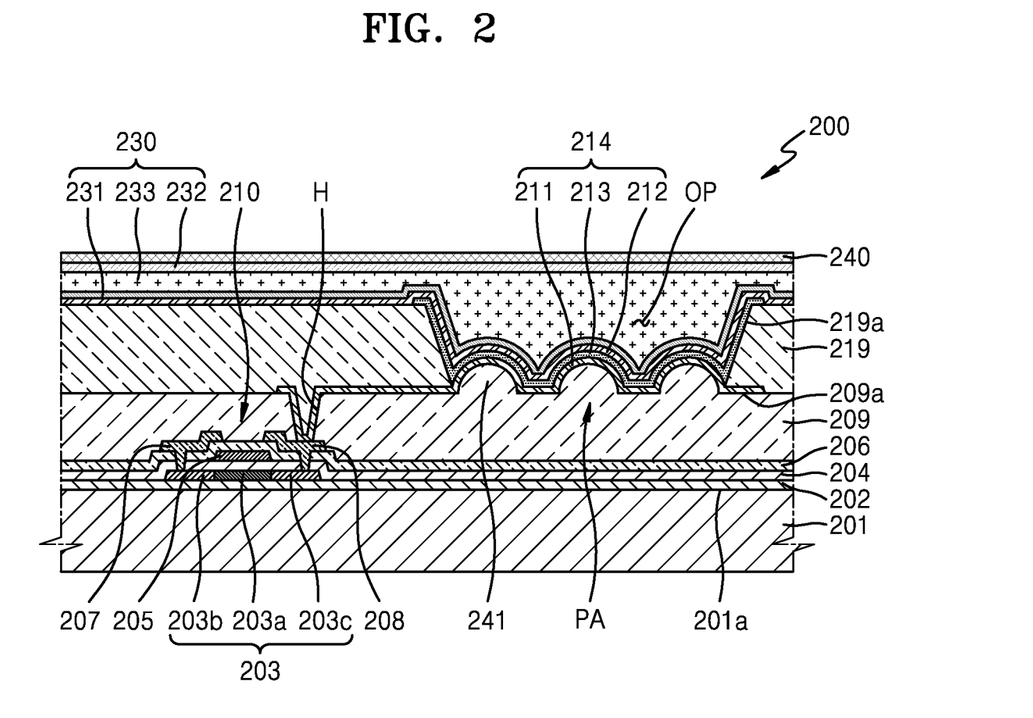
FIG. 2 is an enlarged cross-sectional view of a pixel in an organic light-emitting display apparatus, according to an embodiment of the present disclosure.
Figure 3:
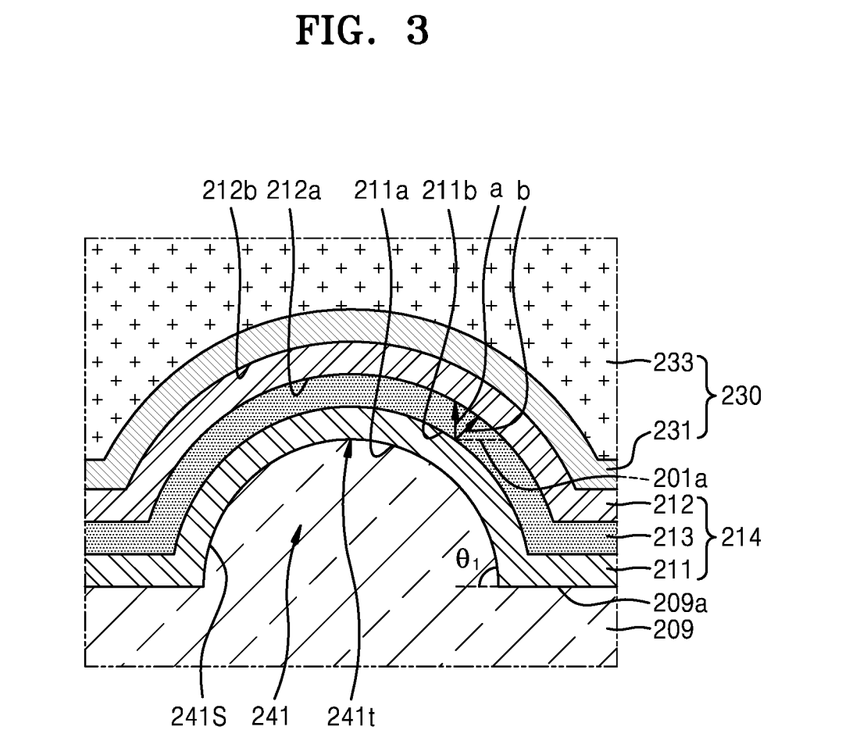
FIG. 3 is an enlarged cross-sectional view of a portion in which is disposed a concave-convex unit shown in FIG. 2.
Figure 4:
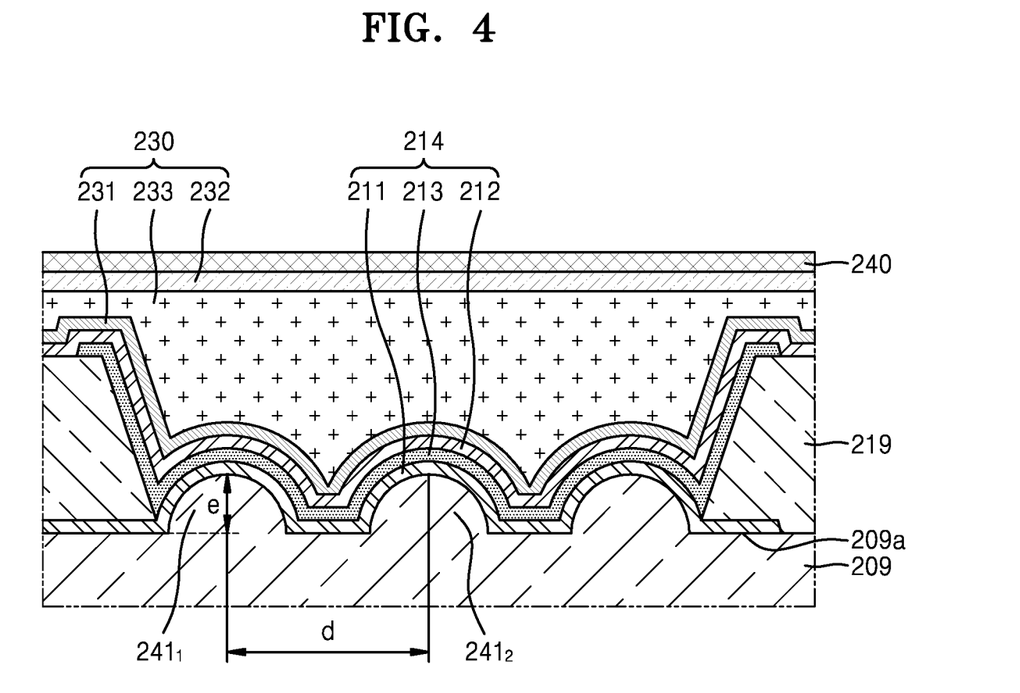
FIG. 4 is an enlarged cross-sectional view of a portion in which are disposed a plurality of concave-convex units shown in FIG. 2.

FIG. 2 is a cross-sectional view of a pixel in an organic light-emitting display apparatus 200 according to an embodiment of the present disclosure, FIG. 3 is an enlarged cross-sectional view of a portion in which is disposed a concave-convex unit 241 shown in FIG. 2, and FIG. 4 is an enlarged view of a portion in which are disposed a plurality of concave-convex units 241 shown in FIG. 2.

Referring to FIGS. 2 through 4, according to an embodiment, the organic light-emitting display apparatus 200 includes a substrate 201 and a thin film encapsulation (TFE) 230 disposed above the substrate 201.

The substrate 201 may be a glass substrate, a polymer substrate, or a flexible film. The substrate 201 may be transparent, opaque, or semi-transparent. The substrate 201 may be flexible.

According to an embodiment, a barrier layer 202 is disposed on the substrate 201. The barrier layer 202 is formed directly on a top surface of the substrate 201. The barrier layer 202 includes an inorganic material.

According to an embodiment, a thin film transistor (TFT) 210 and an organic light-emitting device (OLED) 214 electrically connected to the thin film transistor 210 are disposed on the substrate 201.

According to an embodiment, the thin film transistor 210 includes a semiconductor layer 203, a gate electrode 205, a source electrode 207, and a drain electrode 208. The TFT 210 may be a top gate type thin film transistor in which the semiconductor layer 203, the gate electrode 205, the source electrode 207, and the drain electrode 208 are sequentially stacked. However, embodiments are not limited thereto, and the thin film transistor may be, for example, a bottom gate type transistor.

According to an embodiment, the semiconductor layer 203 includes a channel area 203a, a source area 203b and a drain area 203c respectively positioned at two opposite sides of the channel area 203a. The source area 203b and the drain area 203c may be doped with N-type impurity ions or P-type impurity ions. The source electrode 207 is electrically connected to the source area 203b and the drain electrode 208 is electrically connected to the drain area 203c.

According to an embodiment, the semiconductor layer 203 includes a semiconductor material such as amorphous silicon or polycrystalline silicon. However, embodiments are not limited thereto and the semiconductor layer 203 may includes various other materials. For example, the semiconductor layer 203 can include an organic semiconductor material or an oxide semiconductor material.

According to an embodiment, a gate insulating layer 204 is disposed on the semiconductor layer 203. The gate insulating layer 204 covers the semiconductor layer 203. The gate insulating layer 204 includes an inorganic material. For example, the gate insulating layer 204 includes a silicon oxide or a silicon nitride. The gate insulating layer 204 may be single-layered or multi-layered. The gate insulating layer 204 isolates the semiconductor layer 203 from the gate electrode 205.

According to an embodiment, the gate electrode 205 is disposed on the gate insulating layer 204. The gate electrode 205 is connected to a gate line that transmits on/off signals to the TFT 210.

According to an embodiment, the gate electrode 205 includes a low-resistance metal. For example, the gate electrode 205 includes at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu). The gate electrode 205 may be single-layered or multi-layered.

According to an embodiment, an interlayer insulating layer 206 is disposed on the gate electrode 205. The interlayer insulating layer 206 covers the gate electrode 205. The interlayer insulating layer 206 includes an inorganic material. For example, the interlayer insulating layer 206 includes a silicon oxide or a silicon nitride. The interlayer insulating layer 206 may be single-layered or multi-layered. The interlayer insulating layer 206 insulates the gate electrode 205 from the source electrode 207 and the drain electrode 208.

According to an embodiment, the source electrode 207 and the drain electrode 208 are disposed on the interlayer insulating layer 206. Each of the source and drain electrodes 207 and 208 contacts an area of the semiconductor layer 203. Each of the source and drain electrodes 207 and 208 includes a metal. For example, each of the source and drain electrodes 207 and 208 includes at least one of Al, Pt, Pd, Ag, Mg, Au, Ni, Nd, Ir, Cr, Li, Ca, Mo, Ti, W, or Cu. Each of the source and drain electrodes 207 and 208 may be single-layered or multi-layered. For example, each of the source and drain electrodes 207 and 208 has a three-layered structure that includes Ti, Al, and Ti.

According to an embodiment, a protective layer 209 is disposed on the TFT 210. The protective layer 209 covers the source and drain electrode 207 and 208. The protective layer 209 includes at least one of a passivation layer or a planarization layer. The protective layer 209 may be single-layered or multi-layered. The protective layer 209 includes an organic material. For example, the protective layer 209 includes a general purpose polymer such as poly(methyl methacrylate) (PMMA) or polystyrene (PS), a polymer derivative having a phenol group, an acryl-based polymer, an imide-based polymer, an aryl ether-based polymer, an amide-based polymer, an fluorine-based polymer, p-xylene based polymer, a vinyl alcohol-based polymer, or a blend thereof. In another embodiment, the protective layer 209 has a stack structure that includes an inorganic insulator and an organic insulator.

According to an embodiment, the organic light emitting device 214 is formed on the protective layer 209. The organic light emitting device 214 includes a pixel electrode 211, an opposite electrode 212, and an emission layer 213 disposed between the pixel electrode 211 and the opposite electrode 212.

According to an embodiment, the pixel electrode 211 is disposed on the protective layer 209 and electrically connected to the TFT 210. The pixel electrode 211 may have various forms.

According to an embodiment, the pixel electrode 211 functions as an anode. The pixel electrode 211 may be a reflector. For example, the pixel electrode 211 includes a reflective layer that includes Ag, Mg, Al, Pt, Pd, Au, Ni, Nd, Ir, Cr, a compound of the above-mentioned materials, and a transparent electrode or a semi-transparent electrode disposed on the reflective layer. The transparent or semi-transparent electrode include at least one of indium tin oxide (ITO), indium zinc oxide (IZO), zinc oxide (ZnO), indium oxide ($In_2O_3$), indium gallium oxide (IGO), or aluminum zinc oxide (AZO).

According to an embodiment, the opposite electrode 212 functions as a cathode. The opposite electrode 212 may be a transparent electrode or a semitransparent electrode. For example, the opposite electrode 212 is a metallic thin film having a small work function and that includes Li, Ca, LiF/Ca, LiF/Al, Al, Ag, Mg, or a combination thereof. In yet another embodiment, the opposite electrode 212 includes an auxiliary electrode or a bus electrode disposed on the metallic thin film formed using a transparent conductive material such as ITO, IZO, ZnO, or $In_2O_3$. Accordingly, light emitted from the emission layer 213 can propagate through the opposite electrode 212. The light emitted from an organic emission layer is reflected by the pixel electrode 211 and emitted toward the opposite electrode 212.

However, embodiments are not limited thereto, and the organic light-emitting display apparatus 200 may be a bottom emission type in which light is emitted from an organic emission layer toward the substrate 201. In this case, the pixel electrode 211 includes a transparent or semi-transparent electrode, and the opposite electrode 212 includes a reflective electrode. In addition, the organic light-emitting display apparatus 200 according to an embodiment may be a dual emission type that emits light in two directions, i.e., toward a top surface and a bottom surface.

According to an embodiment, a pixel defining layer 219 is disposed on the pixel electrode 211. The pixel defining layer 219 surrounds the edges of the pixel electrode 211 to delimit an emission area of each pixel. The pixel defining layer 219 includes an organic material. For example, the pixel defining layer 219 includes at least one organic material selected from a polyimide, a polyamide, an acrylic resin, benzocyclobutene, or a phenolic resin. The pixel defining layer 219 exposes a part of the pixel electrode 211, and the emission layer 213 is disposed in the exposed part.

The emission layer 213 may include a low molecular weight organic material or a high molecular weight organic material. The organic light emitting device 214, in addition to the emission layer 213, selectively includes a function layer such as a hole transport layer (HTL), a hole injection layer (HIL), an electron transport layer (ETL), and an electron injection layer (EIL).

According to an embodiment, the TFE 230 covers the organic light emitting device 214. The TFE 230 seals a display unit that displays an image, thereby preventing oxygen or moisture from permeating into the display unit. The TFE 230 includes at least one inorganic layer, such as at least one of a first inorganic layer 231 and a second inorganic layer 232, and at least one organic layer 233. A first inorganic layer 231, an organic layer 233, and a second inorganic layer 232 are stacked in the TFE 230. In an embodiment, the TFE 230 further includes a plurality of inorganic layers and organic layers that are alternately stacked, and the number of inorganic layers and organic layers is not limited.

According to an embodiment, each of the first inorganic layer 231 and the second inorganic layer 232 includes an inorganic material. For example, each of the first inorganic layer 231 and the second inorganic layer 232 includes at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

According to an embodiment, the organic layer 233 includes an organic material. For example, the organic layer 233 includes at least one of an acrylic resin, a methacrylic resin, polyisoprene, a vinyl resin, an epoxy resin, a urethane resin, a cellulose resin, or a perylene resin.

In an embodiment, to reduce a color shift that varies by viewing angle, the protective layer 209 of the organic light-emitting display apparatus 200 includes a plurality of concave-convex units 241. The plurality of concave-convex units 241 are formed in a pixel area PA.

According to an embodiment, each concave-convex unit 241 protrudes from a surface 209a of the protective layer 209 to a predetermined height. The concave-convex unit 241 is integrally formed with the protective layer 209. However, embodiments are not limited thereto, and in other embodiments, the concave-convex unit 241 may be formed by a separate process after the protective layer 209 is formed.

According to an embodiment, a cross section of the concave-convex unit 241 is semicircular. An angle ($\theta_1$) formed where a slope 241s of the concave-convex unit 241 meets a surface 209a of the protective layer 209 is less than or equal to 35 degrees ($\theta_1 \leq 35$ degrees). When the angle $\theta_1$ is greater than 35 degrees, a localized current unbalance phenomenon can occur. The surface 209a of the protective layer 209 is parallel to a horizontal surface 201a of the substrate 201.

According to an embodiment, the concave-convex unit 241 has a slope 241s of a certain degree, and accordingly, the pixel electrode 211, the opposite electrode 212, and the emission layers 213 stacked on the protective layer 209 each have a slope angle corresponding to the slope 241s.

More particularly, according to an embodiment, the pixel electrode 211 is disposed on the protective layer 209. The pixel electrode 211 is electrically connected to the source electrode 207 or the drain electrode 208 via a penetration hole H that penetrates through the protective layer 209. The pixel electrode 211 covers the surface 209a of the protective layer 209 and the concave-convex unit 241 that protrudes from the surface 209a of the protective layer 209.

According to an embodiment, a part of the pixel electrode 211 on the concave-convex unit 241 is exposed via an opening OP in the pixel defining layer 219. The pixel electrode 211 has a curvature that corresponds to a curvature of the concave-convex unit 241. The pixel electrode 211 includes a first surface 211a that faces the concave-convex unit 241 and a second surface 211b that is opposite to the first surface 211a. In an embodiment, the first surface 211a of the pixel electrode 211 directly contacts the concave-convex unit 241.

According to an embodiment, the emission layer 213 is disposed on the pixel electrode 211. For example, the emission layer 213 includes a red emission layer, a green emission layer, and a blue emission layer. The colored emission layer 213 is disposed in each pixel area PA according to the color of light emitted from the emission layer 213. The emission layer 213 covers the pixel electrode 211 exposed via the opening OP. The emission layer 213 extends to a side wall 219a of the pixel defining layer 219. The emission layer 213 has a curvature that corresponds to the curvature of the pixel electrode 211.

According to an embodiment, the opposite electrode 212 is disposed on the emission layer 213. The opposite electrode 212 covers the emission layer 213. The opposite electrode 212, which functions as a common electrode, extends over adjacent pixel areas PA. The opposite electrode 212 has a curvature that corresponds to the curvature of the emission layer 213. The opposite electrode 212 includes a first surface 212a that faces the emission layer 213 and a second surface 212b that is opposite to the first surface 212a. In an embodiment, the first surface 212a of the opposite electrode 212 directly contacts the emission layer 213.

In an embodiment, a functional layer that improves emission efficiency of the organic light emitting device 214 is additionally disposed between at least one of the concave-convex unit 241 and the pixel electrode 211, the pixel electrode 211 and the emission layer 213, and the emission layer 213 and the opposite electrode 212.

According to an embodiment, a distance between the pixel electrode 211 and the opposite electrode 212 can be determined by Equation 1, below.

$$1.05 \leq (a/b) = 1.18 \qquad \text{(Equation 1)}$$

In this case, a is a vertical distance between the pixel electrode 211 and the opposite electrode 212 with respect to the surface 209a of the protective layer 209. The surface 209a of the protective layer 209 is parallel to the horizontal surface 201a of the substrate 201. b is a minimum distance between the pixel electrode 211 and the opposite electrode 212.

In more detail, according to an embodiment, the vertical distance a between the pixel electrode 211 and the opposite electrode 212 corresponds to a vertical distance from the second surface 211b of the pixel electrode 211 to the first surface 212a of the opposite electrode 212. The minimum distance b between the pixel electrode 211 and the opposite electrode 212 corresponds to a minimum distance from the second surface 211b of the pixel electrode 211 to the first surface 212a of the opposite electrode 212. This minimum distance is measured along a line that is normal to the second surface 211b of the pixel electrode 211 and the first surface 212a of the opposite electrode 212.

According to an embodiment, when the pixel electrode 211, the emission layer 213, and the opposite electrode 212 of the organic light emitting device 214 are formed, each of the pixel electrode 211, the emission layer 213, and the opposite electrode 212 has a greatest thickness at a top 241t of the concave-convex unit 241, where the top 241t is a point on the concave-convex unit 241 that is a greatest distance from the surface 209a of the protective layer 209. On the other hand, the thicknesses of the pixel electrode 211, the emission layer 213, and the opposite electrode 212 respectively decrease along the slope 241s with decreasing distance along the slope 241s to the surface 209a of the protective layer 209. As described above, the concave-convex unit 241 is used to improve the viewing angle; however, the concave-convex unit 241 also causes non-uniformities in the thicknesses of the pixel electrode 211, the emission layer 213, and the opposite electrode 212.

However, according to an embodiment, when the distance between the pixel electrode 211 and the opposite electrode 212 is determined by Equation 1, above, in addition to improving the viewing angle, each of the pixel electrode 211, the emission layer 213, and the opposite electrode 212 on the concave-convex unit 241 has a uniform thickness. Accordingly, a localized current unbalance phenomenon can be prevented. In addition, Equation 1 is related to the angle ($\theta_1$) of the concave-convex unit 241. According to Equation 1, the angle ($\theta_1$) of the concave-convex unit 241 is less than or equal to 35 degrees.

In an embodiment, the concave-convex unit 241 has a forward-tapered shape. When the distance between the pixel electrode 211 and the opposite electrode 212, and the angle ($\theta_1$) of the concave-convex unit 241 are respectively in the above-mentioned ranges, each of the pixel electrode 211, the emission layer 213, and the opposite electrode 212 has a uniform thickness.

According to an embodiment, an area occupied by the concave-convex unit 241 on the display area of the substrate is less than or equal to 20% of an area of the pixel area PA on the display area. When the area of the concave-convex unit 241 is in the above-mentioned range, color shift according to the viewing angle can be further reduced.

According to an embodiment, the plurality of concave-convex units 241 are arranged in the pixel area PA. A minimum distance between a first concave-convex unit $241_1$ and an adjacent second concave-convex unit $241_2$ is determined by Equation 2, below.

$$((d/e) \times 100) \geq 5 \qquad \text{Equation 2:}$$

Here, d is a distance between a center of the first concave-convex unit $241_1$, and a center of the adjacent second concave-convex unit $241_2$, and e is a height of each of the first concave-convex unit $241_1$ and the second concave-convex unit $241_2$. The height of the first concave-convex unit $241_1$ is equal to the height of the second concave-convex unit $241_2$. The height e of each of the first concave-convex unit $241_1$ and the second concave-convex unit $241_2$ is a maximum height of the first concave-convex unit $241_1$ and the second concave-convex unit $241_2$. When the minimum distance between the first concave-convex unit $241_1$ and the adjacent second concave-convex unit $241_2$ is determined by Equation 2, above, the reliability of the organic light-emitting display apparatus 200 increases.

Figure 5A:
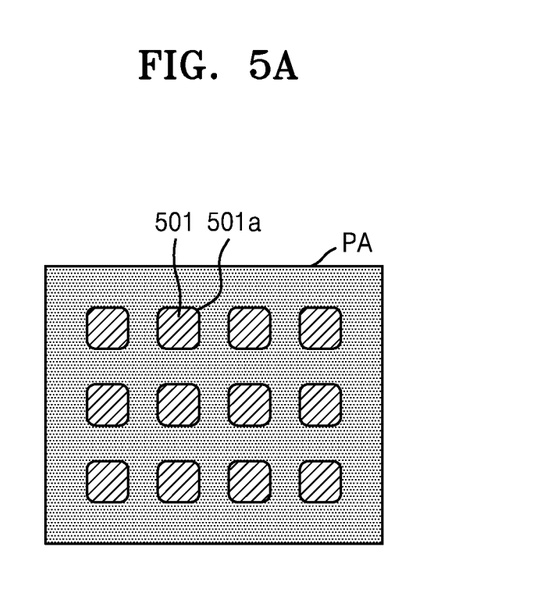
FIGS. 5A through 5D are top-plan views of a plurality of concave-convex units, according to embodiments of the present disclosure.
Figure 5B:
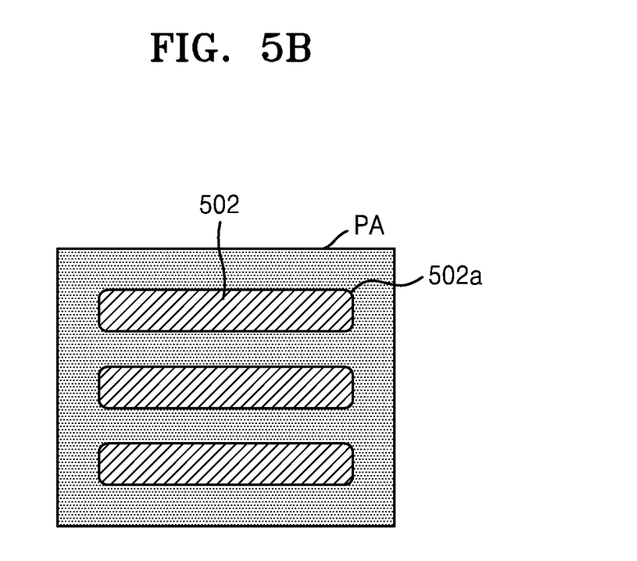
Figure 5C:
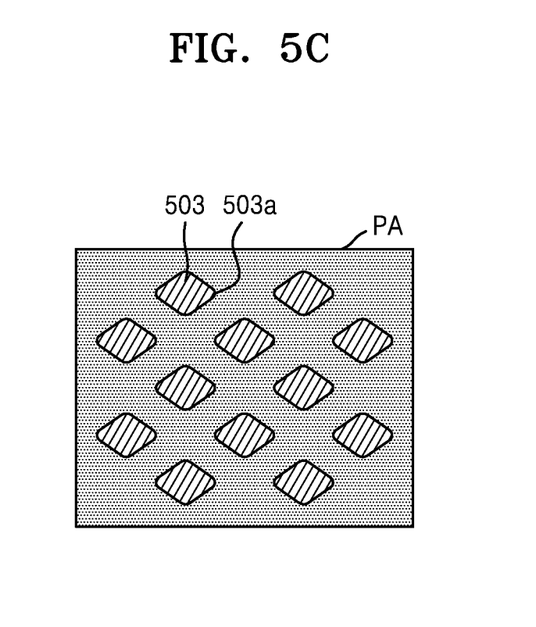
Figure 5D:
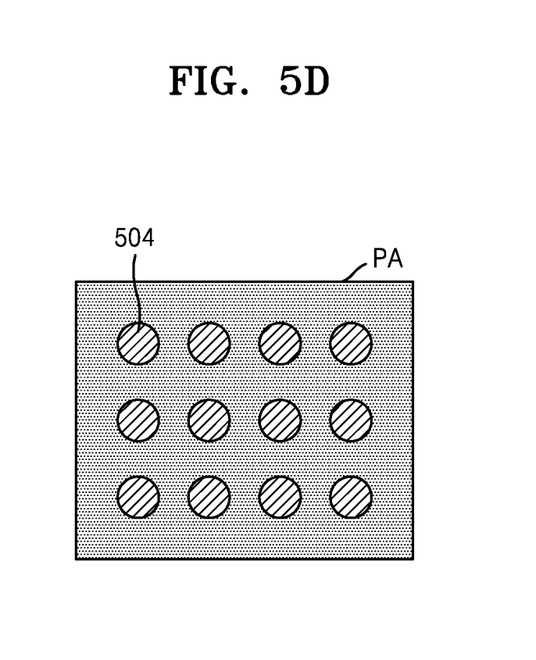

According to an embodiment, the concave-convex unit 241 may be patterned in various forms. For example, the concave-convex unit 241 may, in a plan view, be one of a square shaped concave-convex unit 501 as shown in FIG. 5A, a rectangular shaped concave-convex unit 502 as shown in FIG. 5B, a diamond shaped concave-convex unit 503 as shown in FIG. 5C, or a circular shaped concave-convex unit 504 as shown in FIG. 5D.

In an embodiment, the shape of the concave-convex unit 241 in a plan view may be one of a polygon shape, such as a triangle, a square, a trapezoid, or a parallelogram, a round shape, an oval shape, a wavy shape, a stripe shape, or a dot shape. However, these shapes are exemplary and non-limiting, and the concave-convex units 241 can have other shapes.

In this case, according to an embodiment, boundaries 501a, 502a, 503a, and 504a of the plurality of concave-convex units 501, 502, 503, and 504 are rounded. When each of the boundaries 501a, 502a, 503a, and 504a is rounded, a localized current unbalance phenomenon can be reduced. The boundaries 501a, 502a, 503a, and 504a respectively correspond to boundaries of the plurality of concave-convex units 501, 502, 503, and 504 in the plane of the surface 209a of the protective layer 209.

As described above, according to an embodiment, the pixel electrode 211, the emission layer 213, and the opposite electrode 212 are sequentially stacked on the concave-convex unit 241, and thus, a color shift due to the viewing angle can be reduced.

According to an embodiment, as the concave-convex unit 241 is formed, the emission efficiency of the organic light-emitting display apparatus 200 decreases. To improve the emission efficiency, the organic light-emitting display apparatus 200 further includes a quantum dot layer 240. The quantum dot layer 240 is disposed on an upper surface of the TFE 230. In an embodiment, the quantum dot layer 240 is disposed on the organic light emitting devices 214. The quantum dot layer 240 may have a film shape, but embodiments are not limited thereto, and the quantum dot layer 240 may have other shapes.

According to an embodiment, a quantum dot material included in the quantum dot layer 240 includes particles that exhibit a quantum confinement effect. The quantum dot layer 240 includes a semiconductor compound, such as cadmium telluride (CdTe), cadmium selenide (CdSe), zinc sulfide (ZnS), or cadmium sulfide (CdS). The quantum dot layer 240 increases the emission efficiency due to a surface plasmon effect.

A organic light-emitting display apparatus according to an embodiment of the present disclosure reduces color shift due to the viewing angle of the display panel, thereby improving the display quality of the panel.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus, comprising:
   a substrate that includes a plurality of pixel areas;

a plurality of thin film transistors disposed on the substrate;
a protective layer that covers the plurality of thin film transistors and includes concave portions and convex portions in each of the plurality of pixel areas;
an organic light-emitting device disposed on the protective layer and that includes a pixel electrode, an emission layer, and an opposite electrode; and
an encapsulation unit disposed on the substrate and that covers the organic light-emitting device,
wherein the pixel electrode, the emission layer, and the opposite electrode are stacked on the concave portions and convex portions,
the encapsulation unit comprises a plurality of layers, wherein a lowermost layer of the encapsulation unit comprises an upper surface that includes a plurality of convex pans and concave parts in the pixel areas corresponding to the plurality of convex portions and concave portions of the protective layer in a cross-sectional view, and
wherein each of the concave portions of the protective layer comprises a flat surface that is parallel to a horizontal surface of the substrate.

2. The organic light-emitting display apparatus of claim 1, wherein,
each of the convex portions has a forwardly-tapered shape, and
an angle of the forwardly-tapered shape with respect to the flat surface is less than or equal to 35 degrees.

3. The organic light-emitting display apparatus of claim 2, wherein an area in a plan view of each of the convex portions is less than or equal to 20% of an area of the pixel area.

4. The organic light-emitting display apparatus of claim 2, wherein a minimum distance between adjacent convex portions is determined by Equation 2:

$$((d/e) \times 100) \geq 5, \text{ wherein}$$

'd' is a distance between centers of the adjacent convex portions and
'e' is a height of each of the convex portions.

5. The organic light-emitting display apparatus of claim 2, wherein a cross-section of each of the convex portions has a semicircular shape.

6. The organic light-emitting display apparatus of claim 1, wherein each of the convex portions is shaped in a plan view as one of a polygon, a circle, an oval, a wavy shape, a stripe, or a dot.

7. The organic light-emitting display apparatus of claim 6, wherein a boundary of each of the convex portions is rounded.

8. The organic light-emitting display apparatus of claim 1, farther comprising: a quantum dot layer disposed on an upper surface of the encapsulation unit.

9. The organic light-emitting display apparatus of claim 8, wherein the encapsulation unit includes at least one inorganic layer and at least one organic layer which are sequentially stacked, the lowermost layer of the encapsulation twit comprises the at least one inorganic layer, and the quantum dot layer is disposed on an upper surface of the encapsulation unit.

10. An organic light-emitting display apparatus, comprising:
a substrate;
a plurality of thin film transistors disposed on the substrate;
a protective layer that covers the plurality of thin film transistors and includes two adjacent convex portions and a concave portion that is between the two adjacent convex portions;
an organic light-emitting device disposed on the protective layer and that includes a pixel electrode, an emission layer, and an opposite electrode; and
an encapsulation unit disposed on the substrate and that covers the organic light emitting device,
wherein:
each of the two adjacent convex portions of the protective layer protrudes from a surface of the concave portion and has a slope, and
the encapsulation unit comprises a plurality of layers, wherein a lowermost layer of the encapsulation unit comprises an upper surface that includes two adjacent convex parts and a concave part that respectively correspond to the two adjacent convex portions and the concave portion of the protective layer in a cross-sectional view.

11. The organic light-emitting display apparatus of claim 10,
wherein the surface of the concave portion comprises a flat surface that is parallel to a horizontal surface of the substrate, and
an angle between the slope and the flat surface is less than or equal to 35 degrees.

12. The organic light-emitting display apparatus of claim 11, wherein
the pixel electrode, the emission layer, and the opposite electrode are stacked on the two adjacent convex portions and the concave portion, and
a distance between the pixel electrode and the opposite electrode is determined by Equation 1:

$$1.05 \leq (a/b) \leq 1.18, \text{ wherein}$$

'a' is a vertical distance between the pixel electrode and the opposite electrode, and
'b' is a minim distance between the pixel electrode and the opposite electrode.

13. The organic light-emitting display apparatus of claim 12, wherein
the pixel electrode includes a first surface that faces each of the two adjacent convex portions and the concave portion and a second surface opposite to the first surface,
the opposite electrode includes a first surface that faces the emission layer and a second surface opposite to the first surface,
the vertical distance between the pixel electrode and the opposite electrode corresponds to a vertical distance from the second surface of the pixel electrode to the first surface of the opposite electrode, and
the minimum distance between the pixel electrode and the opposite electrode corresponds to a minimum distance from the second surface of the pixel electrode to the first surface of the opposite electrode.

14. The organic light-emitting display apparatus of claim 12, wherein an area in a plan view of each of the two adjacent convex portions is less than or equal to 20% of an area of the pixel area.

15. The organic light-emitting display apparatus of claim 12, wherein a cross-section of each of the two adjacent convex portions has a semicircular shape.

16. The organic light-emitting display apparatus of claim 10, wherein each of the two adjacent convex portions is shaped in a plan view as one of a polygon, a circle, an oval, a wavy shape, a stripe, or a dot.

17. The organic light-emitting display apparatus of claim 16, a boundary of each of the two adjacent convex portions is rounded.

18. The organic light-emitting display apparatus of claim 10, further comprising: a quantum dot layer disposed on an upper surface of the encapsulation unit.

19. The organic light-emitting display apparatus of claim 1, wherein a distance between the pixel electrode and the opposite electrode is determined by Equation 1:

$1.05 \leq (a/b) \leq 1.18$, wherein

'a' is a vertical distance with respect to the surface of the protective layer between the pixel electrode and the opposite electrode, and b' is a minimum distance between the pixel electrode and the opposite electrode.

20. The organic light-emitting display apparatus of claim 10, wherein the lowermost layer of the encapsulation unit comprises an inorganic layer.

* * * * *